(12) United States Patent
Kim et al.

(10) Patent No.: US 10,170,617 B2
(45) Date of Patent: Jan. 1, 2019

(54) VERTICAL TRANSPORT FIELD EFFECT TRANSISTORS

(71) Applicant: GLOBALFOUNDRIES INC., Grand Cayman (KY)

(72) Inventors: Jiseok Kim, Guilderland, NY (US); Hiroaki Niimi, Cohoes, NY (US); Hoon Kim, Horseheads, NY (US); Puneet Harischandra Suvarna, Menands, NY (US); Steven Bentley, Menands, NY (US); Jody A. Fronheiser, Delmar, NY (US)

(73) Assignee: GLOBALFOUNDRIES, Grand Cayman (KY)

( * ) Notice: Subject to any disclaimer, the term of this patent is extended or adjusted under 35 U.S.C. 154(b) by 0 days.

(21) Appl. No.: 15/424,379

(22) Filed: Feb. 3, 2017

(65) Prior Publication Data
US 2018/0226505 A1    Aug. 9, 2018

(51) Int. Cl.
*H01L 29/78* (2006.01)
*H01L 29/10* (2006.01)
*H01L 29/36* (2006.01)
*H01L 29/66* (2006.01)
*H01L 29/417* (2006.01)

(52) U.S. Cl.
CPC ...... *H01L 29/7827* (2013.01); *H01L 29/1095* (2013.01); *H01L 29/36* (2013.01); *H01L 29/66666* (2013.01); *H01L 29/41741* (2013.01); *H01L 29/7848* (2013.01)

(58) Field of Classification Search
CPC ........... H01L 29/7827; H01L 29/66666; H01L 29/41791; H01L 29/783; H01L 29/7831; H01L 29/785; H01L 29/105; H01L 29/35; H01L 29/66636; H01L 29/78618; H01L 21/823821; H01L 21/845; H01L 21/823418; H01L 21/823814; H01L 27/0886; H01L 27/0924; H01L 27/10826; H01L 27/10879; H01L 27/1211
See application file for complete search history.

(56) References Cited

U.S. PATENT DOCUMENTS

| 2008/0179752 | A1* | 7/2008 | Yamauchi | H01L 29/47 257/768 |
| 2011/0147828 | A1* | 6/2011 | Murthy | H01L 21/02057 257/327 |
| 2013/0062699 | A1* | 3/2013 | Zhu | H01L 29/66795 257/368 |
| 2015/0171189 | A1* | 6/2015 | Lin | H01L 29/66636 438/285 |
| 2016/0211259 | A1* | 7/2016 | Guo | H01L 27/0688 |

* cited by examiner

*Primary Examiner* — David Spalla
(74) *Attorney, Agent, or Firm* — Francois Pagette; Andrew M. Calderon; Roberts Mlotkowski Safran Cole & Calderon, P.C.

(57) ABSTRACT

The present disclosure relates to semiconductor structures and, more particularly, to vertical transport field effect transistor devices and methods of manufacture. A structure includes: a vertical fin structure having a lower dopant region, an upper dopant region and a channel region between the lower dopant region and the upper dopant region; and a doped semiconductor material provided on sides of the vertical fin structure at a lower portion. The lower dopant region being composed of the doped semiconductor material which is merged into the vertical fin structure at the lower portion.

15 Claims, 5 Drawing Sheets

VERTICAL TRANSPORT FIELD EFFECT TRANSISTORS

FIELD OF THE INVENTION

The present disclosure relates to semiconductor structures and, more particularly, to vertical transport field effect transistor devices and methods of manufacture.

BACKGROUND

A vertical transport field effect transistor (VTFET) is a transistor in which the current between the drain and source electrodes is primarily normal to the top surface of the die. That is, a VTFET device is a device in which the current flow between the source and drain regions of the device is primarily orthogonal to the primary surface of the substrate. For example, in a VTFET device, the source and drain are provided at a top and bottom portion of the fin, with the channel along a vertical extent of the fin between the source and drain regions. The VTFET is advantageous in that it allows a more dense and integrated usage of FETs in the active area of the chip, which leads device scaling.

The bottom source region or drain region in VTFETs are formed very early in the flow process. Due to this, the bottom source or drain region see significant thermal steps from downstream process flow. This leads to dopant up-diffusion into the channel which can negatively impact device performance. For example, the dopant up-diffusion can negatively impact mobility, threshold voltage (Vt), short channel effect (SCE) and off-state current ($I_{off}$).

SUMMARY

In an aspect of the disclosure, a structure comprises: a vertical fin structure having a lower dopant region, an upper dopant region and a channel region between the lower dopant region and the upper dopant region; and a doped semiconductor material provided on sides of the vertical fin structure at a lower portion. The lower dopant region being composed of the doped semiconductor material which is merged into the vertical fin structure at the lower portion.

In an aspect of the disclosure, a structure comprises: a vertical fin structure composed of semiconductor material; and a dopant region at a lower portion of the vertical fin structure formed from merged doped semiconductor material.

In an aspect of the disclosure, a method comprises: forming a vertical fin structure having a lower dopant region, an upper dopant region and a channel region between the lower dopant region and the upper dopant region; and forming doped semiconductor material on sides of the vertical fin structure at a lower portion, which merges with the vertical fin structure to form the lower dopant region.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to vertical transport field effect transistor (VTFET) devices and methods of manufacture. More specifically, the present disclosure is directed to vertical transport field effect transistor devices will controllable junction profiles, e.g., channel profiles. Advantageously, the present disclosure provides improved control over the junction profile compared to doped implant processes used in conventional VTFET structures.

More specifically, in embodiments, the VTFET devices described herein are manufactured with processes that significantly control dopant up-diffusion into the channel region of the device. In this way, the VTFET devices described herein have improved device performance, compared to conventional VTFET devices. This disclosure also makes a particularly significant impact on vertical transport FET device process development in smaller technology nodes, particularly in technology nodes of 5 nm and beyond. This disclosure also provides for doping a top portion of the fin prior to fin formation.

The structures of the present disclosure can be manufactured in a number of ways using a number of different tools. In general, though, the methodologies and tools are used to form structures with dimensions in the micrometer and nanometer scale. The methodologies, i.e., technologies, employed to manufacture the structures of the present disclosure have been adopted from integrated circuit (IC) technology. For example, the structures are built on wafers and are realized in films of material patterned by photolithographic processes on the top of a wafer. In particular, the fabrication of the structures uses three basic building blocks: (i) deposition of thin films of material on a substrate, (ii) applying a patterned mask on top of the films by photolithographic imaging, and (iii) etching the films selectively to the mask.

Figure 1:
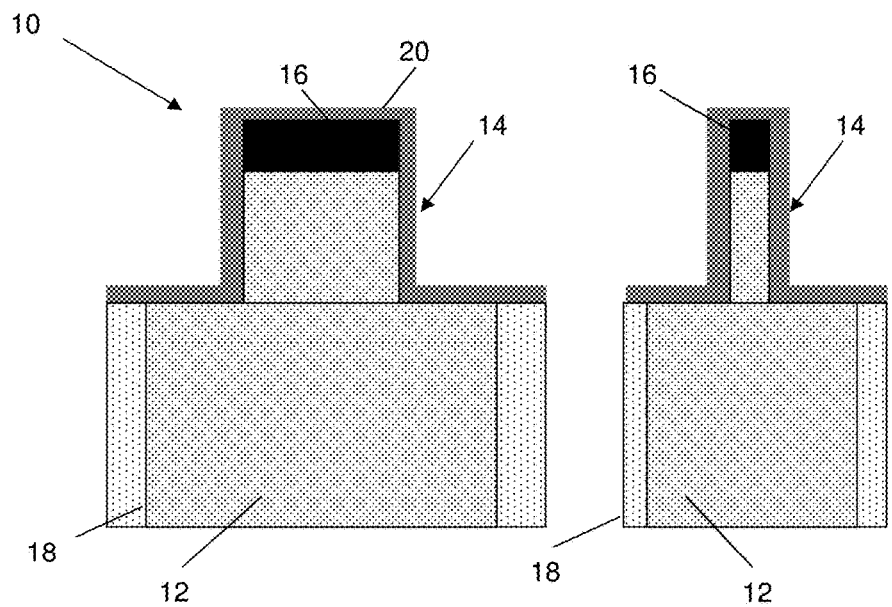
FIG. 1 shows a structure and respective fabrication processes in accordance with aspects of the present disclosure.

FIG. 1 shows a structure and respective fabrication processes in accordance with aspects of the present disclosure. More specifically, the structure 10 shows a fin structure 14 composed of substrate material 12 (e.g., semiconductor material) and a hardmask material 16. In embodiments, the substrate material 12 can be composed of any suitable semiconductor material including, but not limited to, Si, SiGe, SiGeC, SiC, GaAs, InAs, InP, and other III/V or II/VI compound semiconductors. The hardmask material 16 can be SiN material, as an example.

In embodiments, the fin structure 14 can be fabricated using a sidewall image transfer (SIT) technique, for example, using conventional deposition, lithography and etching processes. In an example of a SIT technique, a mandrel material, e.g., SiO$_2$, is deposited on the hardmask material 16 using conventional CVD processes. A resist stack is formed on the mandrel material, and exposed to light to form a pattern (openings). A reactive ion etching (RIE) is performed through the openings to form the mandrels. In embodiments, the mandrels can have different widths and/or spacing depending on the desired dimensions between the narrow structures 14. Spacers are formed on the sidewalls of the mandrels which are preferably material that is different than the mandrels, and which are formed using conventional deposition processes known to those of skill in the art. The spacers can have a width which matches the dimensions of the fin structures 14, for example. The mandrels are removed or stripped using a conventional etching process, selective to the mandrel material. An etching is then performed within the spacing of the spacers to form the sub-lithographic features, e.g., fin structure 14. The sidewall spacers can then be stripped.

Still referring to FIG. 1, shallow trench isolation (STI) structures 18 can be formed about the fin structure 14. In embodiments, the STI structures 18 can be fabricated using conventional lithography and deposition processes, e.g., chemical vapor deposition (CVD), followed by a chemical mechanical polishing (CMP). The STI structures 18 can be composed of insulator material such as, e.g., oxide material.

FIG. 1 further shows a film 20 formed over the fin structure 14 and the STI structures 18. In embodiments, the film 20 can be deposited by a plasma enhanced CVD (PECVD) or atomic layer deposition (ALD) process. The film 20 can be, e.g., a nitride material or bilayer of oxide and nitride. In embodiments, the oxide can be about 1.5 nm thick and the nitride can be about 4.5 nm thick; although other dimensions are also contemplated herein. It should be understood by those of skill in the art that oxide material will provides a cleaner surface after stripping than other known materials, e.g., nitride alone.

Figure 2:
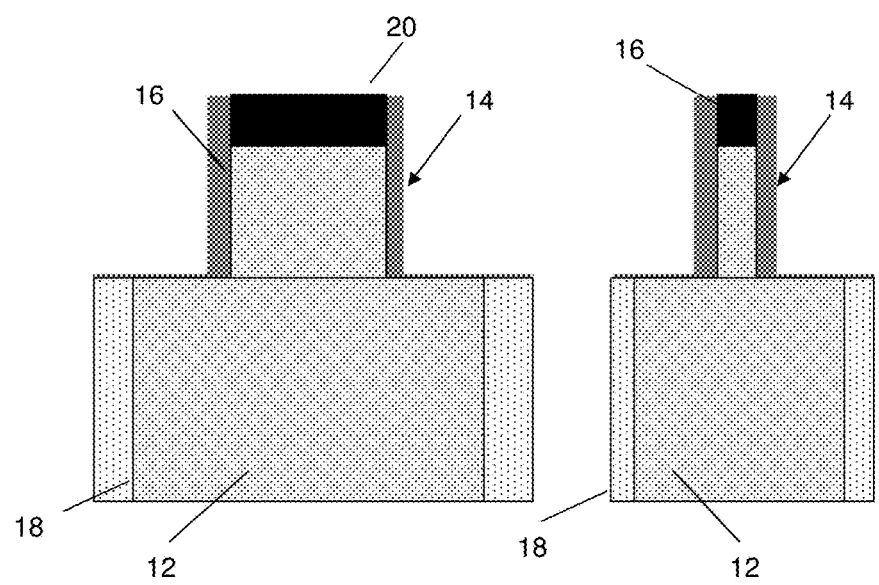
FIG. 2 shows a film on a vertical surface of a fin structure, amongst other features, and respective fabrication processes in accordance with aspects of the present disclosure.

In FIG. 2, the horizontal surfaces of the film 20 can be removed from the top surface of the fin structure 14, e.g., over a top surface of the hard mask 16, and the surfaces of the substrate 12 and STI structures 18. In embodiments, the film 20 can be removed by an anisotropic etching process, with selective chemistries to the film 20.

Figure 3:
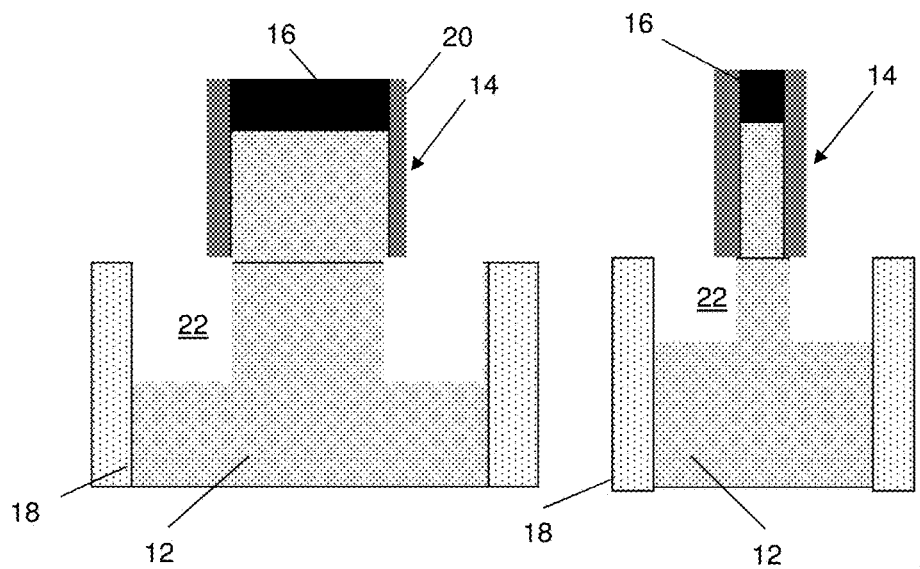
FIG. 3 shows recesses on sides of the fin structure, amongst other features, and respective fabrication processes in accordance with aspects of the present disclosure.

As shown in FIG. 3, a recess 22 is formed in the substrate 12, on sides of the fin structure 14. In embodiments, the recess 22 can be about 20 nm to about 100 nm deep, and more preferably about 30 nm deep; however, it should be recognized by those of skill in the art that the recess depth can depend on the technology node, e.g., aspect ratio (height to width) of the fin structure 14. In embodiments, the recess 22 can be used for the formation of the source region and/or drain region of the fin structure 14.

Still referring to FIG. 3, the recess 22 can be formed by an anisotropic etch followed by an isotropic etch of the substrate 12. As should be understood by those of skill in the art, the etching chemistries will be selective to the substrate 12. Moreover, the fin structure 14 will be protected from the etch chemistries by the film 20 on the sidewalls of the fin structure 14 and the hardmask material 16 on top of the fin structure 14.

Figure 4:
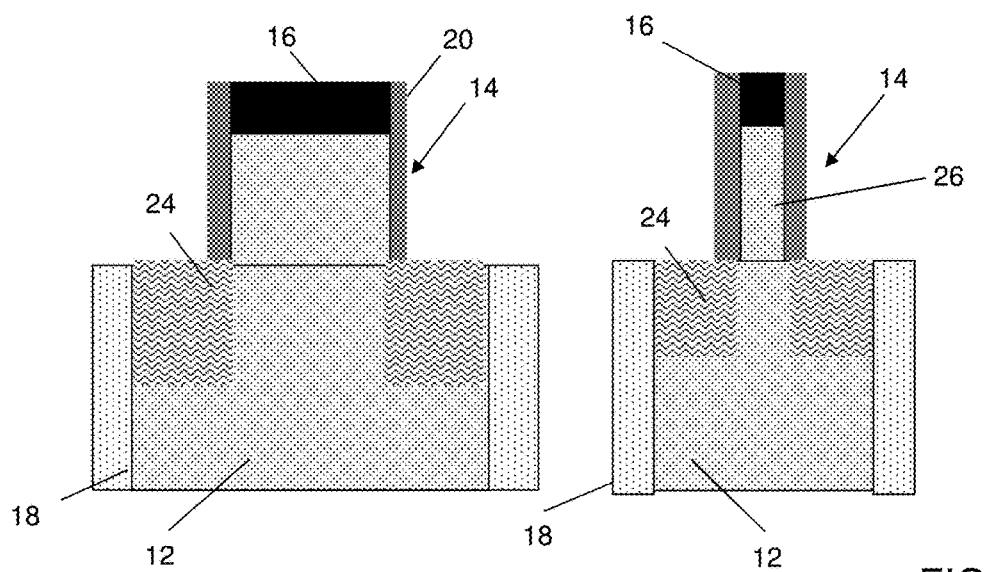
FIG. 4 shows doped semiconductor material within the recess, amongst other features, and respective fabrication processes in accordance with aspects of the present disclosure.

In FIG. 4, a doped semiconductor material 24 is formed within the recess 22. In embodiments, the doped semiconductor material 24 is deposited by an epitaxial growth process, which will stop at the film 20. The doped semiconductor material 24, as in each of the aspects described herein, will merge with the bottom of the fin structure 14, resulting in a source region or a drain region on a lower portion of the fin structure 14. In embodiments, for an NFET device, the doped semiconductor material 24 can be, e.g., Si:As, Si:P or Si:CP, carbon (C) will reduce the out-diffusion of the P near the channel region of the fin structure. For a PFET device, the doped semiconductor material 24 can be Si:B, Si:Ga, SiGe:B, or SiGe:Ga, as examples.

In embodiments, the doped semiconductor material 24 can have a uniform dopant concentration or a dopant gradient concentration, with a low dopant concentration at the bottom and substrate sidewall of the recess 22 (due to the grown process which grows on the substrate material 12) and a higher dopant concentration at the top and away from the sidewalls of the recess 22 (as the profile approaches the STI structures 18). By providing a dopant gradient concentration, it is possible to substantially minimize or entirely eliminate the dopant near the channel region 26 of the fin structure 14, e.g., prevent the dopant from outdiffusing into the channel region 26, while still providing a higher dopant concentration for improved contact resistance, e.g., lower contact resistance.

In embodiments, the doped semiconductor material 24 can be provided with a dopant gradient concentration by ramping up the gas flow concentration in the doping chamber. By way of one illustrative non-limiting example, the gas flow concentration in the doping chamber can be ramped from 1E19 cm$^{-3}$ to 1E21 cm$^{-3}$ to provide a desired dopant gradient.

Figure 5:
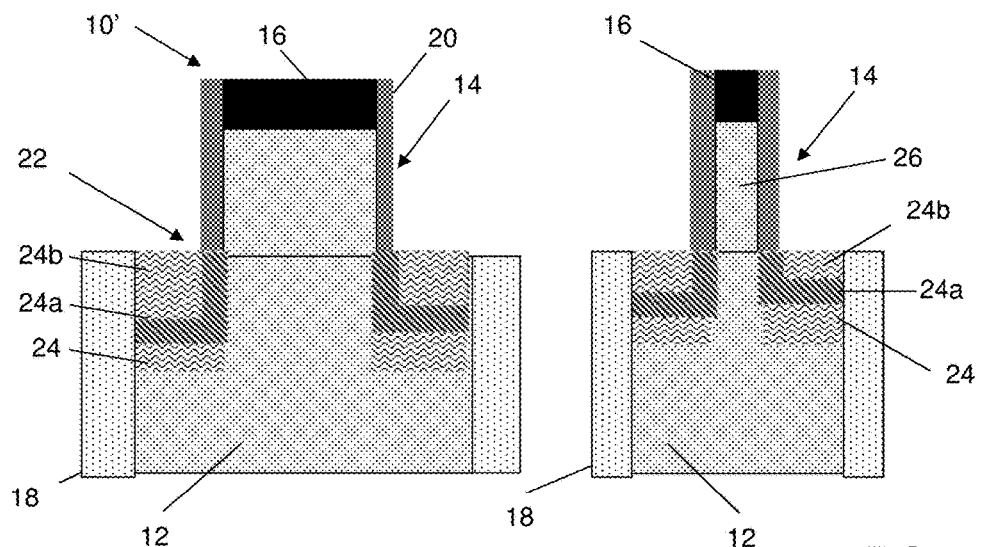
FIG. 5 shows a structure and respective fabrication processes in accordance with additional aspects of the present disclosure.

FIG. 5 shows a structure and respective fabrication processes in accordance with additional aspects of the present disclosure. In FIG. 5, the structure 10' includes a tri-layer of material within the recess 22. For example, a high doped semiconductor material 24 and 24b is provided in a lower portion and upper portion of the recess 22, respectively, with a low doped semiconductor material 24a sandwiched therebetween. As previously disclosed, the doped semiconductor material 24, 24a, 24b can deposited by an epitaxial growth process, which will stop at the film 20.

In embodiments, the lower doped semiconductor material 24a will extend on the sidewalls of the recess 22, nearest to the channel region 26 of the fin structure 14. In this way, it is possible to minimize the dopant concentration near the channel region 26 of the fin structure 14, while still providing a higher dopant concentration for improved contact resistance using the high doped semiconductor material 24b. In embodiments, the high doped semiconductor material can be Si:As or Si:CP; whereas, the low doped semiconductor material 24a can be Si:P.

Figure 6:
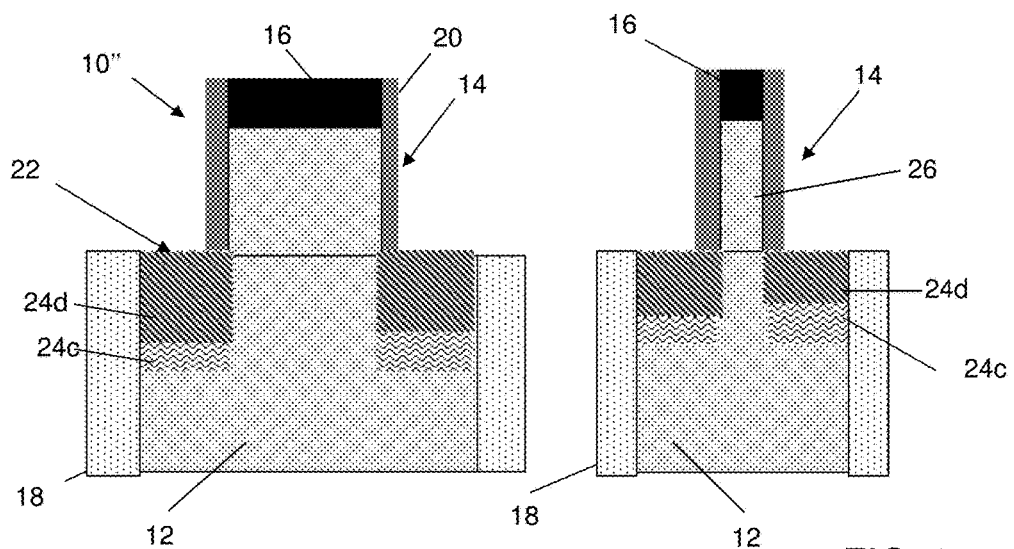
FIG. 6 shows a structure and respective fabrication processes in accordance with additional aspects of the present disclosure.

FIG. 6 shows a structure and respective fabrication processes in accordance with additional aspects of the present disclosure. In FIG. 6, the structure 10" includes a bi-layer of material with the recess 22. For example, a doped semiconductor material 24c is provided in the recess 22 and along its sidewall, nearest to the channel region 26. Also, in this embodiment, the doped semiconductor material 24d is provided in the remaining portion of the recess 22, on the doped semiconductor material 24c. In embodiments, the doped semiconductor material 24c can have a higher band gap than the doped semiconductor material 24d in order to reduce the off current of the transistor; whereas, the doped semiconductor material 24d will provide a lower contact resistance and higher on current. In embodiments, the doped semiconductor material 24d will reduce the Gate-Induced-Drain-Leakage (GIDL) and provide a higher diffusion into the fin bottom. By way of examples, the doped semiconductor material 24c can be Si:B and the doped semiconductor material 24d can be SiGe:B.

Figure 7:
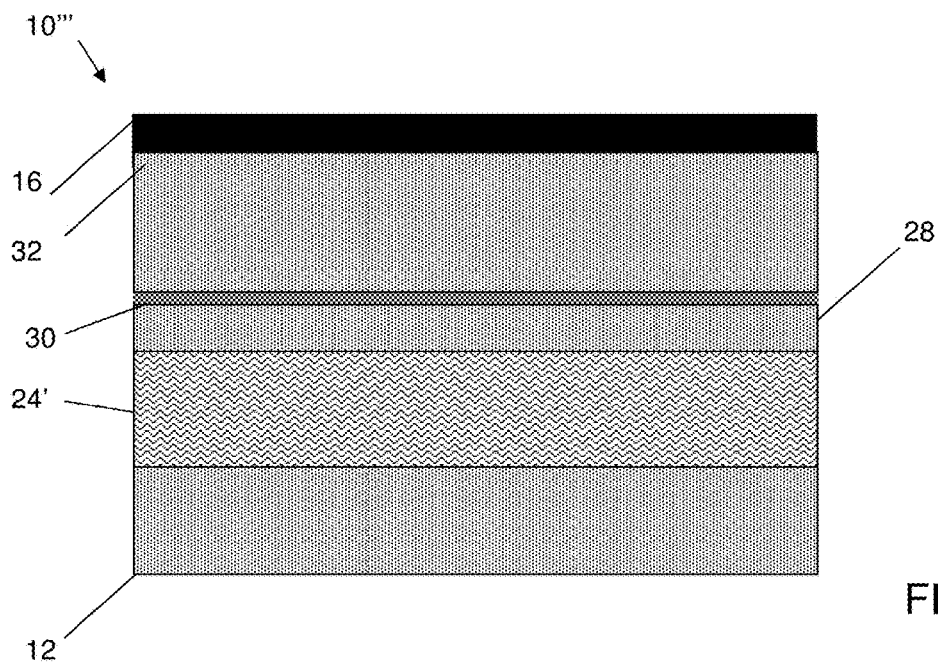
FIGS. 7-9 show structures and respective fabrication processes in accordance with further aspects of the present disclosure.
Figure 8:
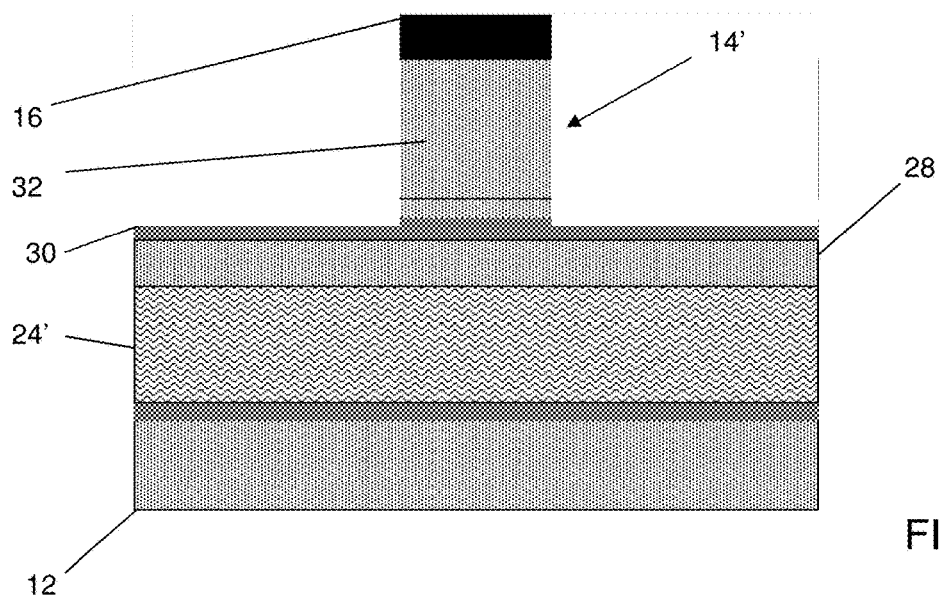
Figure 9:
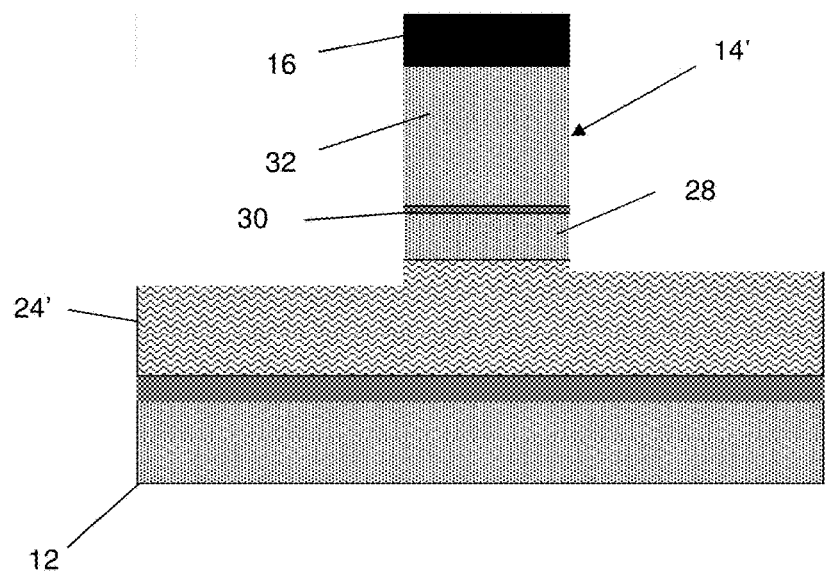

FIGS. 7-9 show structures and respective fabrication processes in accordance with further aspects of the present disclosure. In the structure 10''' of FIG. 7, a doped semiconductor material 24' is deposited on a substrate 12. The doped semiconductor material 24' will be used for the formation of a source region or drain region of a VTFET.

As noted above, the doped semiconductor material 24' can be provided with a uniform or gradient dopant, i.e., by ramping up the gas flow concentration in the doping chamber as already disclosed herein. The doped semiconductor material 24' can be epitaxially grown on the substrate, e.g., semiconductor material, to a thickness of about 20 nm to about 100 nm deep, and more preferably about 30 nm deep; however, it should be recognized by those of skill in the art that the thickness can depend on the technology node, e.g., aspect ratio (height to width) of the subsequently formed fin structure. For an NFET device, the doped semiconductor material 24' can be, e.g., Si:As, Si:P or Si:CP; whereas, for a PFET device, the doped semiconductor material 24' can be Si:B, Si:Ga, SiGe:B, or SiGe:Ga as examples.

Still referring to FIG. 7, an undoped layer of semiconductor material 28 is formed on the doped semiconductor material 24'. The undoped layer of semiconductor material 28 can be any appropriate semiconductor material, as already described herein. A marking layer 30 is deposited on the undoped layer of semiconductor material 28. In embodiments, the marking layer 30 can be, e.g., Si:C or SiGe; although other materials are contemplated by the present invention. For example, any material that acts as a diffusion barrier layer and which is selective to the upper layers can be used as the marking layer 30. In embodiments, the marking layer 30 allows for the detection of fin RIE depth during the fin RIE process, and can also serve as a diffusion barrier to reduce dopant up-diffusion.

An undoped layer of semiconductor material 32 is formed on marking layer 30. The undoped layer of semiconductor material 32 can be a channel region of the subsequently formed VTFET device. A hardmask 16, e.g., SiN, is deposited on the undoped layer of semiconductor material 32. It should be recognized by those of skill in the art that the layers 30, 32 and 16 can be deposited by any conventional deposition process, e.g., CVD.

In FIG. 8, a fin structure 14' is formed using conventional etching processes as described above, e.g., SIT, from the layers 32 and 16, with the etching stopping on the marking layer 30. In embodiments, the marking layer 30 will act as an etch stop layer preventing further etching into the underlying layer 28. In this way, a timed etching process can be used to more accurately control the source drain recess shown in FIG. 9.

Figure 10:
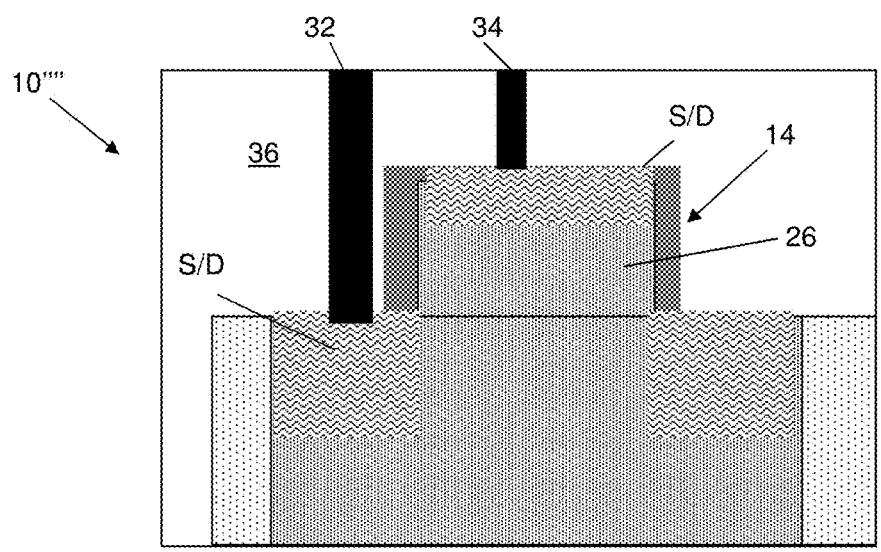
FIG. 10 shows contacts for a VTFET device, amongst other features, and respective fabrication processes in accordance with aspects of the present disclosure.

FIG. 10 shows contact formation to the VTFET device 10''''. The structure 10'''' shown in FIG. 10 can be any of the structures shown in FIGS. 4-6 and 9, with contacts 32 and 34 formed on the source region or drain region. In embodiments, the contacts 32, 34 can be, e.g., tungsten with a TiN liner. The contacts 32, 34 can be formed by conventional lithography, etching and deposition processes. Also, the upper source region or drain region can be formed by conventional ion implantation or doping processes, which occur late in the fabrication flow process.

Prior to forming the contact, silicide regions can be formed on the source and drain regions. As should be understood by those of skill in the art, the silicide process begins with deposition of a thin transition metal layer, e.g., nickel, cobalt or titanium, over fully formed and patterned semiconductor devices (e.g., doped or ion implanted source and drain regions). After deposition of the material, the structure is heated allowing the transition metal to react with exposed silicon (or other semiconductor material as described herein) in the active regions of the semiconductor device (e.g., source, drain, gate contact region) forming a low-resistance transition metal silicide. Following the reaction, any remaining transition metal is removed by chemical etching, leaving silicide contacts in the active regions of the device.

Following the silicide process, an interlevel dielectric material 36, e.g., oxide or other insulator material, is formed over the structure. The interlevel dielectric material 36 can be formed by a blanket oxide deposition process. The contacts 32, 34 are then formed through the interlevel dielectric material 36, contacting the source region and the drain region. For example, after a deposition of interlevel dielectric material 36, a resist formed over the interlevel dielectric material 36 is exposed to energy (light) to form a pattern (opening). An etching process with a selective chemistry, e.g., reactive ion etching (RIE), will be used to form one or more trenches in the interlevel dielectric material 36 through the openings of the resist and contacting the source region and drain region. The resist can then be removed by a conventional oxygen ashing process or other known stripants. Following the resist removal, the conductive material e.g., tungsten with a TiN liner, can be deposited by any conventional deposition processes, e.g., chemical vapor deposition (CVD) processes. Any residual material on the surface of the insulator material 36 can be removed by conventional CMP processes.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:
1. A structure, comprising:
    a vertical fin structure composed of semiconductor material and having a lower dopant region at a lower portion of the vertical fin structure, an upper dopant region at an upper portion of the vertical fin structure and a channel region between the lower dopant region and the upper dopant region;

a recessed portion in the semiconductor material adjacent to the lower dopant region at a lower portion of the vertical fin structure;

shallow trench isolation structures formed in the semiconductor material, adjacent to the recessed portion; and doped semiconductor material in the recessed portion in the semiconductor material on sides of the vertical fin structure at the lower portion and adjacent to the shallow trench isolation structures, the lower dopant region being composed of the doped semiconductor material at the lower portion, wherein the doped semiconductor material comprises a tri-layer of material within the recessed portion, with a higher doped semiconductor material in a lower portion and upper portion of the recessed portion, and a lower doped semiconductor material sandwiched therebetween.

2. The structure of claim 1, wherein the lower dopant region is a source region or a drain region.

3. The structure of claim 1, wherein the doped semiconductor material is an epitaxially grown doped semiconductor material that merges into the lower portion of the vertical fin structure, the doped semiconductor material is Si:As, Si:P or Si:CP for an NFET device and Si:B, Si:Ga, SiGe:B, or SiGe:Ga for a PFET device.

4. The structure of claim 3, wherein the doped semiconductor material has a uniform dopant concentration.

5. The structure of claim 3, wherein the doped semiconductor material has a dopant gradient concentration, with a lower dopant concentration at a bottom and sidewall of the semiconductor material in the recessed portion and a higher dopant concentration at a top and away from the sidewall of the recessed portion.

6. The structure of claim 1, wherein the lower doped semiconductor material extends on the sidewall of the recessed portion, nearest to the channel region of the vertical fin structure.

7. The structure of claim 3, wherein the doped semiconductor material provided in the recessed portion and along its sidewall nearest to the channel region has a higher band gap than the doped semiconductor material in remaining portions of the recess.

8. The structure of claim 1, wherein the vertical fin structure is composed of the doped semiconductor material, undoped layer of semiconductor material on the doped semiconductor material, a marking layer on the undoped layer of semiconductor material and an undoped layer of semiconductor material on marking layer.

9. The structure of claim 1, wherein:
the vertical fin structure is a vertical gate structure composed of the semiconductor material,
the upper dopant region is provided in the semiconductor material at the upper portion of the vertical gate structure,
the lower dopant region is provided in the semiconductor material at the lower portion of the vertical gate structure, which comprises dopant of doped epitaxial material provided in the recessed portion of the semiconductor material, and the channel region is provided in an undoped portion of the semiconductor material of the vertical gate structure between the upper dopant region and the lower dopant region.

10. A structure, comprising:
a vertical fin structure composed of semiconductor material, and comprising a lower dopant region at a lower portion of the vertical fin structure, an upper dopant region at an upper portion of the vertical fin structure and a channel region between the lower dopant region and the upper dopant region;
a recessed portion in the semiconductor material directly on sidewalls of the vertical fin structure at the lower dopant region; and
a doped material in the recessed portion directly on the sidewalls of the vertical fin structure, the lower dopant region being composed of a same dopant of the doped material at the lower portion of the vertical fin structure,
wherein the doped semiconductor material has a tri-layer of material within the recessed portion, with a higher doped semiconductor material in a lower portion and upper portion of the recessed portion, and a lower doped semiconductor material sandwiched therebetween, which extends on the sidewall of the recessed portion, nearest to a channel region of the vertical fin structure.

11. The structure of claim 10, wherein the doped semiconductor material is an epitaxially grown doped semiconductor material composed of Si:As, Si:P or Si:CP for an NFET device and Si:B, Si:Ga, SiGe:B, or SiGe:Ga for a PFET device.

12. The structure of claim 10, wherein the doped semiconductor material has a uniform dopant concentration.

13. The structure of claim 10, wherein the doped semiconductor material has a dopant gradient concentration, with a lower dopant concentration at a bottom and sidewall of the recess at the semiconductor material and a higher dopant concentration at a top and away from the sidewall of the recess.

14. The structure of claim 10, wherein the vertical fin structure is composed of the doped semiconductor material, undoped layer of semiconductor material on the doped semiconductor material, a marking layer on the undoped layer of semiconductor material and an undoped layer of semiconductor material on marking layer.

15. The structure of claim 10, wherein:
the vertical fin structure is a vertical gate structure composed of the semiconductor material,
the dopant region at the upper portion is provided in the semiconductor material,
the dopant region at the lower portion is provided in the semiconductor material, which is dopant from doped epitaxial material provided in the recessed portion of the semiconductor material, and
a channel region is provided in an undoped portion of the semiconductor material of the vertical gate structure between the dopant region at the upper portion and the dopant region at the lower portion of the vertical gate structure.

* * * * *